(12) United States Patent
Iizuka

(10) Patent No.: US 9,266,315 B2
(45) Date of Patent: Feb. 23, 2016

(54) SEPARATING APPARATUS

(71) Applicant: Disco Corporation, Tokyo (JP)

(72) Inventor: Kentaro Iizuka, Tokyo (JP)

(73) Assignee: Disco Corporation, Tokyo (JP)

( * ) Notice: Subject to any disclaimer, the term of this patent is extended or adjusted under 35 U.S.C. 154(b) by 54 days.

(21) Appl. No.: 14/134,052

(22) Filed: Dec. 19, 2013

(65) Prior Publication Data

US 2014/0196855 A1    Jul. 17, 2014

(30) Foreign Application Priority Data

Jan. 17, 2013  (JP) .................................. 2013-006184

(51) Int. Cl.
*B32B 38/10* (2006.01)
*B32B 43/00* (2006.01)
*H01L 21/00* (2006.01)
*H01L 21/687* (2006.01)

(52) U.S. Cl.
CPC .............. *B32B 43/006* (2013.01); *H01L 21/00* (2013.01); *H01L 21/687* (2013.01); *Y10T 156/1184* (2015.01); *Y10T 156/1961* (2015.01); *Y10T 156/1967* (2015.01)

(58) Field of Classification Search
CPC ............ B32B 43/006; Y10T 156/1184; Y10T 156/1961; Y10T 156/1967
USPC ............................................................ 29/239
See application file for complete search history.

(56) References Cited

U.S. PATENT DOCUMENTS

| 6,746,559 B2* | 6/2004 | Ohmi et al. .................... 156/239 |
| 7,182,234 B2* | 2/2007 | Rayssac et al. ..................... 225/2 |
| 7,406,994 B2* | 8/2008 | Martinez et al. .............. 156/762 |
| 8,470,129 B1* | 6/2013 | Wang ............................. 156/705 |
| 2013/0062020 A1* | 3/2013 | Ries et al. ...................... 156/715 |

FOREIGN PATENT DOCUMENTS

JP     2005-516415      6/2005

* cited by examiner

*Primary Examiner* — Mark A Osele
(74) *Attorney, Agent, or Firm* — Greer Burns & Crain Ltd.

(57) ABSTRACT

A separating apparatus for separating a composite substrate into a first substrate and a second substrate previously bonded to each other. The separating apparatus includes a support base having a supporting surface for supporting the composite substrate, a pair of side surface supporting rollers for supporting the peripheral side surface of the composite substrate placed on the supporting surface, and a separating unit for applying a separating force to the boundary between the first substrate and the second substrate constituting the composite substrate supported to the supporting surface of the support base and the side surface supporting rollers, thereby separating the composite substrate into the first substrate and the second substrate.

2 Claims, 4 Drawing Sheets

SEPARATING APPARATUS

BACKGROUND OF THE INVENTION

1. Field of the Invention

The present invention relates to a separating apparatus for separating a composite substrate into a first substrate and a second substrate previously bonded to each other.

2. Description of the Related Art

In an optical device fabrication process, a light emitting layer is formed through a buffer layer on the front side of a substantially disk-shaped epitaxy substrate such as a sapphire substrate and a silicon carbide substrate, wherein the light emitting layer is composed of an n-type semiconductor layer and a p-type semiconductor layer from gallium nitride (GaN), indium gallium phosphide (InGaP), or aluminum gallium nitride (AlGaN). The light emitting layer is partitioned into a plurality of regions by a plurality of crossing streets, and a plurality of optical devices such as light emitting diodes and laser diodes are respectively formed in the plural regions, thus obtaining an optical device wafer. The optical device wafer is divided along the streets to manufacture the individual optical devices.

As a technique for improving the luminance of an optical device, a manufacturing method called lift-off is disclosed in JP-T-2005-516415. This method includes the steps of bonding a transfer substrate of molybdenum (Mo), copper (Cu), silicon (Si), etc. through a bonding metal layer of gold tin (AuSn) etc. to a light emitting layer composed of an n-type semiconductor layer and a p-type semiconductor layer, wherein the light emitting layer is formed through a buffer layer on the front side of an epitaxy substrate of sapphire, silicon carbide, etc. constituting an optical device wafer, next applying a laser beam having an absorption wavelength (e.g., 248 nm) to the buffer layer from the back side of the epitaxy substrate to thereby break the buffer layer, and next separating the epitaxy substrate from the light emitting layer, thereby transferring the light emitting layer to the transfer substrate.

SUMMARY OF THE INVENTION

When the laser beam is applied from the back side of the epitaxy substrate in the condition where the focal point of the laser beam is set at the buffer layer, gallium nitride (GaN), indium gallium phosphide (InGaP), or aluminum gallium nitride (AlGaN) forming the buffer layer is decomposed into Ga and gas ($N_2$ etc.), thus breaking the buffer layer. However, the buffer layer thus broken contains a region where gallium nitride (GaN), indium gallium phosphide (InGaP), or aluminum gallium nitride (AlGaN) has been decomposed into Ga and gas ($N_2$ etc.) and a region where the above-mentioned material of the buffer layer has not been decomposed. Accordingly, the break of the buffer layer becomes nonuniform, causing a problem such that the epitaxy substrate cannot be smoothly separated.

Further, in the case that asperities are formed on the front side of the epitaxy substrate, so as to improve the luminance of each optical device, there is another problem such that the laser beam may be interrupted by the wall of the asperities and the break of the buffer layer may be accordingly suppressed to cause a difficulty in separating the epitaxy substrate.

It is therefore an object of the present invention to provide a separating apparatus which can easily separate a composite substrate into a first substrate and a second substrate previously bonded to each other.

In accordance with an aspect of the present invention, there is provided a separating apparatus for separating a composite substrate into a first substrate and a second substrate previously bonded to each other, the separating apparatus including: a support base having a supporting surface for supporting the composite substrate in a horizontal condition; side surface supporting means provided on the support base for supporting the peripheral side surface of the composite substrate placed on the supporting surface; and separating means for applying a separating force to the boundary between the first substrate and the second substrate constituting the composite substrate supported to the supporting surface of the support base and the side surface supporting means, thereby separating the composite substrate into the first substrate and the second substrate; the separating means including a separating member provided in parallel relationship with the supporting surface of the support base at a position opposed to the side surface supporting means, the separating member having a wedge portion adapted to be penetrated into the boundary between the first substrate and the second substrate, separating member positioning means for moving the separating member in a direction perpendicular to the supporting surface of the support base to thereby position the wedge portion at the height of the boundary between the first substrate and the second substrate, and separating member advancing and retracting means for advancing and retracting the wedge portion of the separating member with respect to the boundary between the first substrate and the second substrate constituting the composite substrate supported to the supporting surface of the support base and the side surface supporting means.

Preferably, the side surface supporting means includes at least two rollers for rotatably supporting the peripheral side surface of the composite substrate. Preferably, the separating apparatus further includes detecting means for detecting the boundary between the first substrate and the second substrate constituting the composite substrate supported to the supporting surface of the support base and the side surface supporting means to align the wedge portion of the separating member with the boundary between the first substrate and the second substrate.

As described above, the separating apparatus according to the present invention includes the support base having the supporting surface for supporting the composite substrate in a horizontal condition, the side surface supporting means provided on the support base for supporting the peripheral side surface of the composite substrate placed on the supporting surface, and the separating means for applying a separating force to the boundary between the first substrate and the second substrate constituting the composite substrate supported to the supporting surface of the support base and the side surface supporting means, thereby separating the composite substrate into the first substrate and the second substrate. The separating means includes the separating member provided in parallel relationship with the supporting surface of the support base at a position opposed to the side surface supporting means, wherein the separating member has the wedge portion adapted to be penetrated into the boundary between the first substrate and the second substrate. The separating means further includes the separating member positioning means for moving the separating member in a direction perpendicular to the supporting surface of the support base to thereby position the wedge portion at the height of the boundary between the first substrate and the second substrate, and the separating member advancing and retracting means for advancing and retracting the wedge portion of the separating member with respect to the boundary between the first substrate and the second substrate constituting the composite substrate supported to the supporting surface of the support base and the side surface supporting means. Accordingly, when the wedge portion of the separating member is penetrated into the boundary between the first substrate and the second substrate at a plurality of positions, a separating force can be applied to the boundary between the first substrate and the second substrate at the plural positions. By applying the present invention to a lift-off process of separating an epitaxy substrate from a light emitting layer and then transferring the light emitting layer to a transfer substrate, the epitaxy substrate can be separated easily and reliably even in the case that the break of a buffer layer formed at the boundary between the epitaxy substrate and the light emitting layer is nonuniform or in the case that asperities are formed on the front side of the epitaxy substrate.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
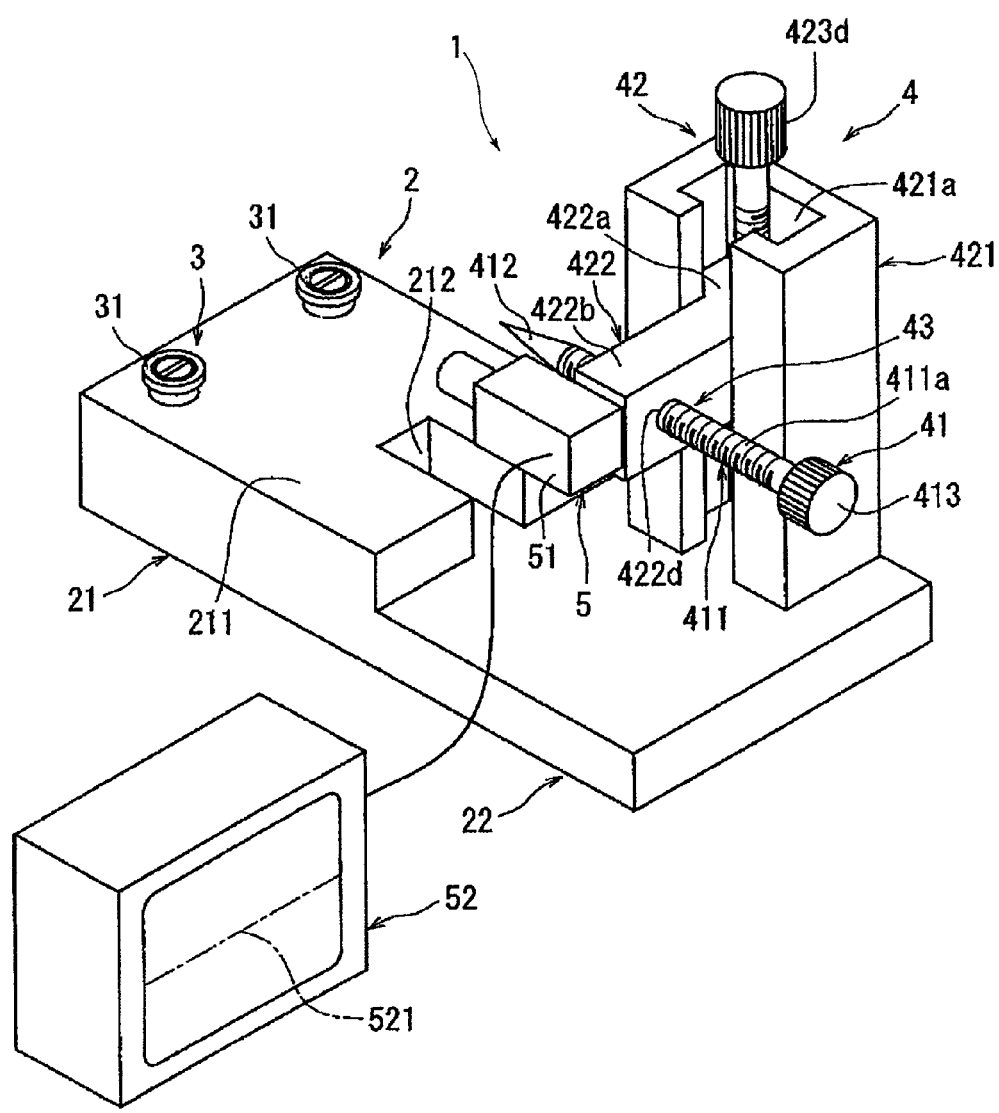
FIG. 1 is a perspective view of a separating apparatus according to a preferred embodiment of the present invention.
Figure 2:
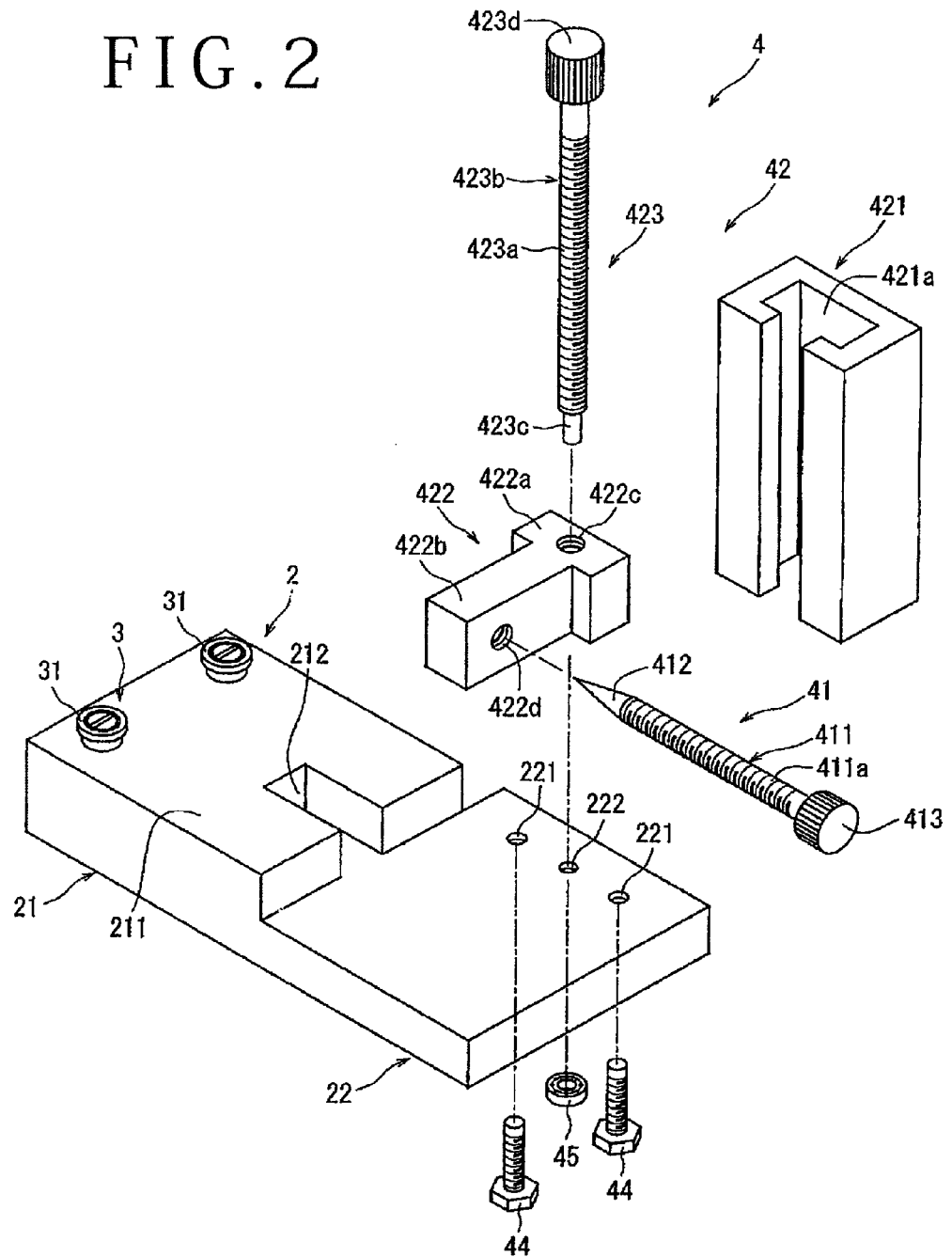
FIG. 2 is an exploded perspective view of essential components of the separating apparatus shown in FIG. 1.

A preferred embodiment of the separating apparatus according to the present invention will now be described in detail with reference to the attached drawings. FIG. 1 is a perspective view of a separating apparatus 1 according to a preferred embodiment of the present invention, and FIG. 2 is an exploded perspective view of essential components of the separating apparatus 1 shown in FIG. 1.

The separating apparatus 1 includes a support base 2 for supporting a composite substrate to be hereinafter described, side surface supporting means 3 provided on the support base 2 for supporting the peripheral side surface of the composite substrate, and separating means 4 for separating the composite substrate supported to the support base 2 and the side surface supporting means 3.

The support base 2 is composed of a composite substrate supporting portion 21 and a separating means supporting portion 22 formed on the front side of the composite substrate supporting portion 21 so as to be lowered in level from the composite substrate supporting portion 21. The composite substrate supporting portion 21 has a supporting surface 211 for supporting the composite substrate thereon in a horizontal condition. Further, a clearance groove 212 for allowing the movement of a separating member to be hereinafter described is formed at a central portion of the front end (on the side of the separating means supporting portion 22) of the composite substrate supporting portion 21.

Figure 3:
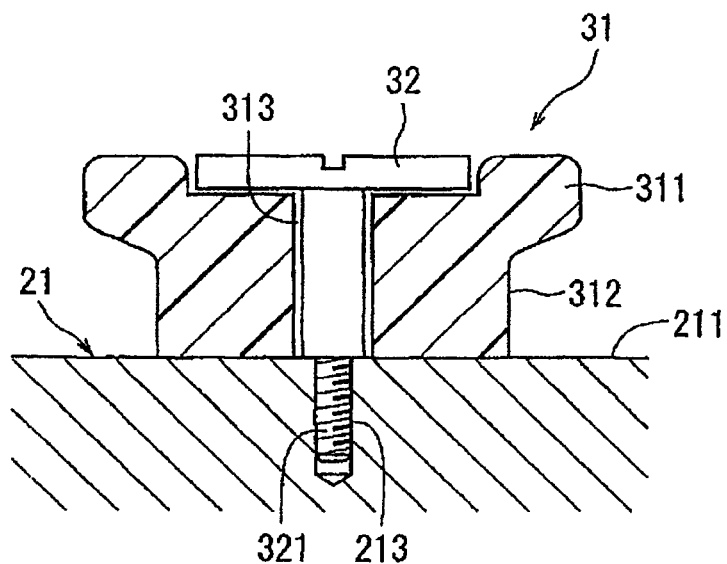
FIG. 3 is a sectional view of an essential part of side surface supporting means constituting the separating apparatus shown in FIG. 1.

The side surface supporting means 3 is provided on the supporting surface 211 of the support base 2. The side surface supporting means 3 is constituted of two rollers 31. As shown in FIG. 3, each roller 31 has an upper large-diameter portion 311 and a lower small-diameter portion 312. A central through hole 313 axially extends through each roller 31. Each roller 31 is formed of suitable synthetic resin. A support bolt 32 is inserted through the through hole 313 of each roller 31. An externally threaded portion 321 is formed at the front end portion (lower end portion) of the support bolt 32. The externally threaded portion 321 of the support bolt 32 is engaged with an internally threaded portion 213 formed in the support base 2. Accordingly, each roller 31 is rotatably supported through the support bolt 32 to the support base 2.

Referring back to FIGS. 1 and 2, the separating means 4 includes a separating member 41 for separating the composite substrate supported to the support base 2 and the side surface supporting means 3, separating member positioning means 42 for moving the separating member 41 in a direction perpendicular to the supporting surface 211 of the support base 2, and separating member advancing and retracting means 43 for advancing and retracting the separating member 41 with respect to the composite substrate supported to the support base 2 and the side surface supporting means 3. The separating member 41 is composed of a stemlike body portion 411 formed with an external screw thread 411a on the outer circumferential surface, a conical wedge portion 412 provided at one end of the body portion 411, and a rotationally operated portion 413 provided at the other end of the body portion 411.

The separating member positioning means 42 includes a guide member 421 provided on the separating means supporting portion 22 of the support base 2, a movable block 422 provided so as to be vertically movable along the guide member 421, and moving means 423 for vertically moving the movable block 422 along the guide member 421. The guide member 421 is formed with a T-shaped guide groove 421a extending vertically. The lower end portion of the guide member 421 is formed with two internally threaded holes (not shown) for engaging two mounting bolts to be hereinafter described. The separating means supporting portion 22 of the support base 2 is formed with two mounting holes (through holes) 221 respectively corresponding to the above-mentioned two internally threaded holes of the guide member 421. Two mounting bolts 44 are inserted through the two mounting holes 221 of the separating means supporting portion 22 from the lower side thereof in the condition where the lower end surface of the guide member 421 is placed on the separating means supporting portion 22 so that the two internally threaded holes of the guide member 421 are respectively aligned with the two mounting holes 221. Further, the two mounting bolts 44 are respectively engaged with the two internally threaded holes of the guide member 421 to thereby mount the guide member 421 on the separating means supporting portion 22. Although not shown, the lower surface (back side) of the separating means supporting portion 22 is formed with two recesses respectively corresponding to the two mounting holes 221 for receiving the heads of the two mounting bolts 44.

The movable block 422 has a T-shaped structure composed of a supported portion 422a slidably engaged with the guide groove 421a of the guide member 421 and a separating member supporting portion 422b projecting from one side surface of the supported portion 422a. The supported portion 422a is formed with an internally threaded hole (through hole) 422c extending vertically. The separating member supporting portion 422b is formed with an internally threaded hole (through hole) 422d extending horizontally and engaged with the external screw thread 411a of the body portion 411 of the separating member 41.

The moving means 423 is composed of a stem portion 423b having an external screw thread 423a on the outer circumferential surface for engaging the internally threaded hole 422c of the supported portion 422a of the movable block 422, a supported portion 423c provided at one end (lower end) of the stem portion 423b, and a rotationally operated portion 423d provided at the other end (upper end) of the stem portion 423b. The stem portion 423b having the external screw thread 423a is engaged with the internally threaded hole 422c of the supported portion 422a of the movable block 422. In this condition, the movable block 422 is slidably engaged with the guide groove 421a of the guide member 421, and the supported portion 423c of the moving means 423 is inserted through a support hole (through hole) 222 (see FIG. 2) formed in the separating means supporting portion 22 of the support base 2. Further, the lower end of the supported portion 423c is engaged with a bearing 45 provided on the separating means supporting portion 22, so that the moving means 423 is rotatably supported through the bearing 45 to the separating means supporting portion 22. Accordingly, when the rotationally operated portion 423d of the moving means 423 is held by an operator to rotate the stem portion 423b in one direction, the movable block 422 can be moved upward along the guide groove 421a, whereas when the stem portion 423b is rotated in the other direction, the movable block 422 can be moved downward along the guide groove 421a. Although not shown, the lower surface (back side) of the separating means supporting portion 22 is formed with a recess corresponding to the support hole 222 for receiving the bearing 45 by press fit.

The external screw thread 411a of the body portion 411 of the separating member 41 is engaged with the internally threaded hole 422d of the separating member supporting portion 422b of the movable block 422. When the rotationally operated portion 413 is held by the operator to rotate the body portion 411 in one direction, the conical wedge portion 412 provided at one end of the body portion 411 can be advanced toward the side surface supporting means 3, whereas when the body portion 411 is rotated in the other direction, the conical wedge portion 412 can be retracted away from the side surface supporting means 3. Accordingly, the external screw thread 411a formed on the outer circumferential surface of the body portion 411 of the separating member 41, the rotationally operated portion 413 provided at the other end of the body portion 411, and the internally threaded hole 422d formed in the separating member supporting portion 422b of the movable block 422 function as the separating member advancing and retracting means 43 for advancing and retracting the wedge portion 412 of the separating member 41 with respect to the composite substrate supported to the supporting surface 211 of the support base 2 and the side surface supporting means 3.

Referring back to FIG. 1, the separating apparatus 1 further includes detecting means 5 for detecting the boundary between a first substrate and a second substrate constituting the composite substrate supported to the supporting surface 211 of the support base 2 and the side surface supporting means 3 to align the wedge portion 412 of the separating member 41 with this boundary. The detecting means 5 is composed of imaging means 51 for imaging the side surface of the composite substrate supported to the supporting surface 211 of the support base 2 and the side surface supporting means 3, and display means 52 for displaying an image obtained by the imaging means 51. The imaging means 51 is mounted on the separating member supporting portion 422b of the movable block 422 at the same vertical position as that of the wedge portion 412. There is displayed on the display means 52 a hairline 521 indicating the vertical center position of the image obtained by the imaging means 51 and corresponding to the wedge portion 412.

Figure 4:
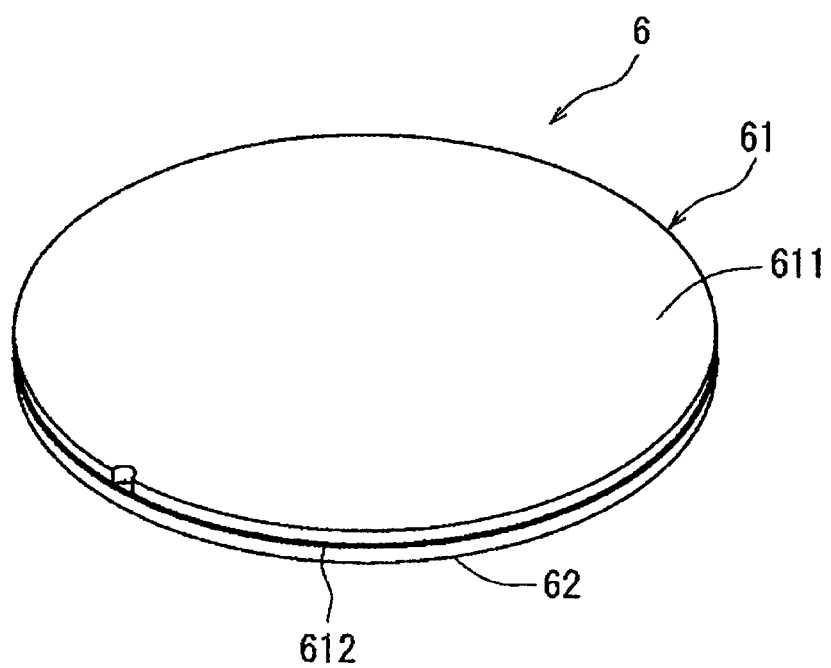
FIG. 4 is a perspective view of a composite substrate to be separated by the separating apparatus shown in FIG. 1.

The operation of the separating apparatus 1 configured above will now be described. FIG. 4 is a perspective view of a composite substrate 6 to be separated by the separating apparatus 1. The composite substrate 6 shown in FIG. 4 is composed of an optical device wafer 61 and a transfer substrate 62. The optical device wafer 61 is composed of an epitaxy substrate 611 (first substrate) such as a sapphire substrate and a silicon carbide substrate, a buffer layer 612 formed on the front side (lower surface) of the epitaxy substrate 611, and an optical device layer (not shown) formed on the front side (lower surface) of the buffer layer 612. The transfer substrate 62 (second substrate) is formed of molybdenum (Mo), copper (Cu), silicon (Si), etc. The transfer substrate 62 is bonded through a bonding metal layer (not shown) of gold tin (AuSn) to the front side (lower surface) of the optical device layer formed on the epitaxy substrate 611 (first substrate) through the buffer layer 612 of the optical device wafer 61. The buffer layer 612 in the composite substrate 6 has already been broken by applying a laser beam having a wavelength (e.g., 248 nm) to be absorbed by the buffer layer 612 from the back side (upper surface) of the epitaxy substrate 611.

Figure 5:
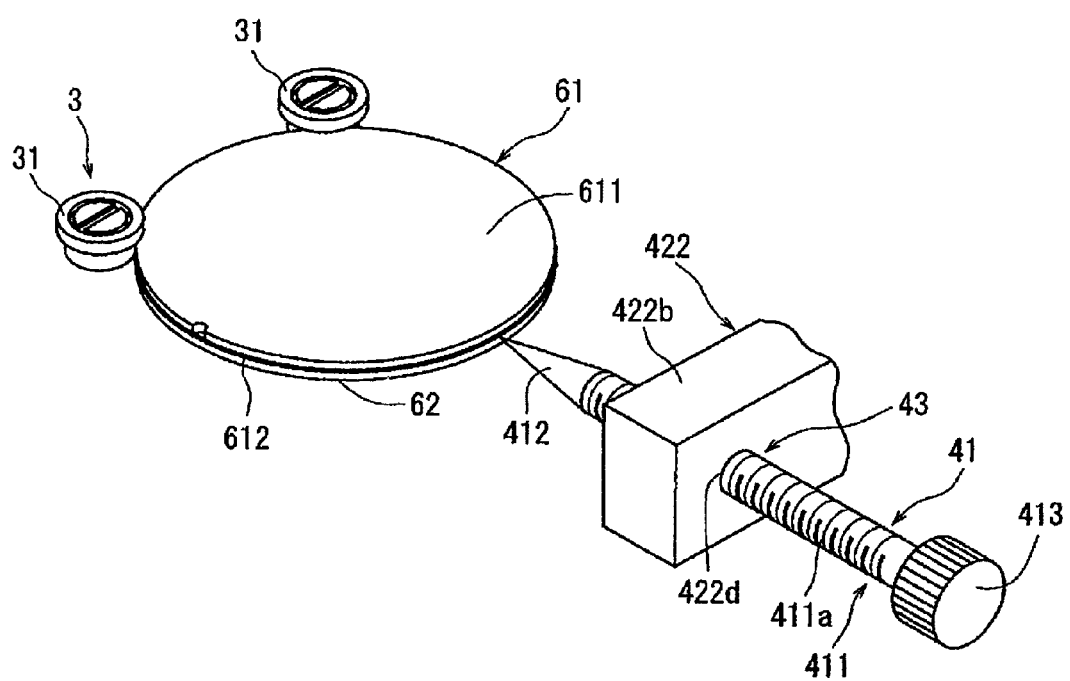
FIG. 5 is a perspective view for illustrating a separating member positioning step to be performed by using the separating apparatus shown in FIG. 1.

In separating the composite substrate 6 into the epitaxy substrate 611 (first substrate) and the transfer substrate 62 (second substrate) including the optical device layer by using the separating apparatus 1, the composite substrate 6 is placed on the supporting surface 211 of the support base 2 in the condition where the transfer substrate 62 (second substrate) is in contact with the supporting surface 211. Further, as shown in FIG. 5, the peripheral side surface of the composite substrate 6 is brought into abutment against the two rollers 31 constituting the side surface supporting means 3. Accordingly, the composite substrate 6 is rotatably supported to the two rollers 31 by the abutment of the peripheral side surface of the composite substrate 6 against the two rollers 31.

In the condition where the composite substrate 6 is supported to the supporting surface 211 of the support base 2 and the two rollers 31 constituting the side surface supporting means 3, the rotationally operated portion 423d of the moving means 423 constituting the separating member positioning means 42 is rotated in one direction or the other direction to thereby move the movable block 422 upward or downward so that the front end of the wedge portion 412 of the separating member 41 mounted to the movable block 422 is positioned at the height of the buffer layer 612 as the boundary between the epitaxy substrate 611 (first substrate) and the transfer substrate 62 (second substrate) including the optical device layer as shown in FIG. 5 (separating member positioning step). In performing this separating member positioning step, the detecting means 5 is operated to image the peripheral side surface of the composite substrate 6 through the imaging means 51 and display the image of the peripheral side surface of the composite substrate 6 through the display means 52. By making the alignment of the buffer layer 612 with the hairline 521 (see FIG. 1) on the display means 52, the front end of the wedge portion 412 of the separating member 41 can be easily positioned at the height of the buffer layer 612 as the boundary between the epitaxy substrate 611 (first substrate) and the transfer substrate 62 (second substrate) including the optical device layer.

Thereafter, the rotationally operated portion 413 of the separating member 41 is rotated in one direction to thereby advance the separating member 41 toward the composite substrate 6 so that the front end of the wedge portion 412 is penetrated by 1 to 2 mm into the buffer layer 612 as the boundary between the epitaxy substrate 611 (first substrate) and the transfer substrate 62 (second substrate) including the optical device layer (wedge advancing step).

After performing the wedge advancing step, the rotationally operated portion 413 of the separating member 41 is rotated in the other direction to thereby retract the separating member 41 so that the wedge portion 412 is retracted from the buffer layer 612 as the boundary between the epitaxy substrate 611 (first substrate) and the transfer substrate 62 (second substrate) including the optical device layer (wedge retracting step). After performing the wedge retracting step, the composite substrate 6 is rotated in contact with the two rollers 31 by a predetermined angle (e.g., 30 degrees) (composite substrate positioning step).

Thereafter, the wedge advancing step, the wedge retracting step, and the composite substrate positioning step are sequentially repeated to thereby apply a separating force from the wedge portion 412 to a plurality of positions on the boundary between the epitaxy substrate 611 (first substrate) and the transfer substrate 62 (second substrate) including the optical device layer. Accordingly, the epitaxy substrate 611 (first substrate) can be easily separated from the transfer substrate 62 (second substrate). As a result, the optical device layer formed through the buffer layer 612 on the front side of the epitaxy substrate 611 (first substrate) is transferred to the transfer substrate 62 (second substrate).

While a specific preferred embodiment of the present invention has been described with reference to the drawings, the present invention is not limited to the above preferred embodiment, but various modifications may be made within the scope of the present invention. For example, the rotationally operated portion 423d of the moving means 423 constituting the separating member positioning means 42 and the rotationally operated portion 413 of the separating member 41 are manually operated in the above preferred embodiment, pulse motors may be mounted to the rotationally operated portion 423d and the rotationally operated portion 413. Further, a rotatable chuck table for holding the composite substrate 6 under suction may be provided on the supporting surface 211 of the support base 2. In this case, the composite substrate 6 can be automatically separated into the first substrate and the second substrate.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A separating apparatus for separating a composite substrate into a first substrate and a second substrate previously bonded to each other, said separating apparatus comprising:
 a support base having a supporting surface for supporting said composite substrate in a horizontal condition;
 side surface supporting means provided on said support base for supporting the peripheral side surface of said composite substrate placed on said supporting surface; and
 separating means for applying a separating force to the boundary between said first substrate and said second substrate constituting said composite substrate supported to said supporting surface of said support base and said side surface supporting means, thereby separating said composite substrate into said first substrate and said second substrate;
 said separating means including
 a separating member provided in parallel relationship with said supporting surface of said support base at a position opposed to said side surface supporting means, said separating member having a wedge portion adapted to be penetrated into the boundary between said first substrate and said second substrate,
 separating member positioning means for moving said separating member in a direction perpendicular to said supporting surface of said support base to thereby position said wedge portion at the height of the boundary between said first substrate and said second substrate, and
 separating member advancing and retracting means for advancing and retracting said wedge portion of said separating member with respect to the boundary between said first substrate and said second substrate constituting said composite substrate supported to said supporting surface of said support base and said side surface supporting means;
 wherein said side surface supporting means includes at least two rollers for rotatably supporting the peripheral side surface of said composite substrate.

2. The separating apparatus according to claim 1, further comprising
 detecting means for detecting the boundary between said first substrate and said second substrate constituting said composite substrate supported to said supporting surface of said support base and said side surface supporting means to align said wedge portion of said separating member with the boundary between said first substrate and said second substrate.

\* \* \* \* \*